(12) United States Patent
Esch et al.

(10) Patent No.: US 11,539,356 B2
(45) Date of Patent: Dec. 27, 2022

(54) VOLTAGE COMPARATOR

(71) Applicant: STMicroelectronics (Grenoble 2) SAS, Grenoble (FR)

(72) Inventors: Helene Esch, Seyssinet Pariset (FR); David Chesneau, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 148 days.

(21) Appl. No.: 17/078,317

(22) Filed: Oct. 23, 2020

(65) Prior Publication Data

US 2021/0126536 A1 Apr. 29, 2021

(30) Foreign Application Priority Data

Oct. 24, 2019 (FR) ...................................... 1911934

(51) Int. Cl.
| | | |
|---|---|---|
| H03K 5/24 | (2006.01) | |
| G05F 1/56 | (2006.01) | |
| G05F 3/24 | (2006.01) | |
| H02M 3/158 | (2006.01) | |
| H02M 3/335 | (2006.01) | |
| H03K 17/082 | (2006.01) | |
| H03K 17/687 | (2006.01) | |
| H03K 19/00 | (2006.01) | |
| H02M 3/00 | (2006.01) | |

(52) U.S. Cl.
CPC .......... *H03K 5/2472* (2013.01); *G05F 1/561* (2013.01); *G05F 3/24* (2013.01); *H02M 3/00* (2013.01); *H02M 3/158* (2013.01); *H02M 3/33507* (2013.01); *H03K 17/0822* (2013.01); *H03K 17/687* (2013.01); *H03K 19/0027* (2013.01)

(58) Field of Classification Search
None
See application file for complete search history.

(56) References Cited

U.S. PATENT DOCUMENTS

| | | | |
|---|---|---|---|
| 4,418,332 A | 11/1983 | Mefford | |
| 4,609,906 A | 9/1986 | Wiegel | |
| 6,778,111 B1 | 8/2004 | Zhu et al. | |
| 6,867,571 B2 * | 3/2005 | Nebon | H02M 3/1588 323/284 |
| 7,176,699 B2 * | 2/2007 | Trochut | H03H 1/02 324/76.28 |
| 7,397,292 B1 | 7/2008 | Potanin | |
| 8,164,357 B2 | 4/2012 | Cauli et al. | |
| 8,258,769 B2 * | 9/2012 | Zambetti | H02M 3/1584 323/224 |
| 10,404,246 B2 | 9/2019 | Binet et al. | |
| 2004/0027098 A1 | 2/2004 | Nebon | |
| 2007/0182396 A1 | 8/2007 | Inatomi | |
| 2008/0298092 A1 | 12/2008 | Sugahara | |

(Continued)

FOREIGN PATENT DOCUMENTS

| | | |
|---|---|---|
| EP | 3116127 A1 | 1/2017 |
| JP | H0795769 A | 4/1995 |

*Primary Examiner* — Jeffery S Zweizig

(74) *Attorney, Agent, or Firm* — Slater Matsil, LLP

(57) ABSTRACT

In an embodiment, a voltage comparator includes: a first switch having a conduction terminal coupled to an internal node that is coupled to an output of the voltage comparator; a current source; a capacitor; and a second switch connected in parallel with the capacitor, wherein the current source, the capacitor, and the first switch are coupled in series.

20 Claims, 3 Drawing Sheets

(56) References Cited

U.S. PATENT DOCUMENTS

2012/0126901 A1     5/2012   Leung et al.
2012/0313601 A1    12/2012   Deguchi et al.
2019/0348976 A1    11/2019   Binet et al.

* cited by examiner

VOLTAGE COMPARATOR

CROSS-REFERENCE TO RELATED APPLICATIONS

This application claims the benefit of French Patent Application No. 1911934, filed on Oct. 24, 2019, which application is hereby incorporated herein by reference.

TECHNICAL FIELD

The present disclosure relates generally to an electronic system and method, and, in particular embodiments, to a voltage comparator.

BACKGROUND

Voltage comparators are provided in many electronic circuits. In an electronic circuit comprising a voltage comparator, the state of its binary output signal may condition the implementation of a step or of a control.

For example, a voltage comparator is generally provided in a switched-mode voltage converter where a voltage for powering the converter is chopped by the switching of switches to implement phases of power storage in an inductance or inductive element and phases of delivery, to a load connected to the converter output, of the power stored in the inductance. The implementation of a switching of at least one of the converter switches is then conditioned by the binary state of the comparator output signal.

Known voltage comparators have various disadvantages, which may in particular result in malfunctions of the voltage converters comprising such known voltage comparators.

SUMMARY

Some embodiments relate voltage comparators configured to deliver a binary signal having a state representative of the comparison between two voltages received by two respective inputs of the comparator.

An embodiment overcomes all or part of the disadvantages of known voltage comparators.

An embodiment provides a voltage comparator comprising:
a first switch having a conduction terminal connected to an internal node;
a current source;
a capacitor; and
a second switch connected in parallel with the capacitor,
wherein the current source, the capacitor, and the first switch are series-connected.

According to an embodiment, a terminal of the current source is coupled, preferably connected, to the capacitor, another terminal of the current source being coupled, preferably connected, to a first node of application of a first DC potential.

According to an embodiment, when a variation of the potential of the internal node towards the first potential causes a switching of an output of the comparator, the first switch is configured to turn on and the second switch is configured to turn off after the turning-on of the first switch.

According to an embodiment, the comparator further comprises a first inverter having an input coupled, preferably connected, to the internal node and having an output controlling the first switch.

According to an embodiment, the first inverter is configured to control a turning on of the first switch after the variation of the potential of the internal node.

According to an embodiment, the comparator further comprises a second inverter having an input coupled to the internal node and having an output coupled, preferably connected, to the output of the comparator and controlling the second switch.

According to an embodiment, the second inverter is configured to control a turning off of the second switch after the variation of the potential of the internal node.

According to an embodiment, the comparator comprises at least two inverters in series between the internal node and the output of the comparator, the second inverter forming part of the at least two inverters.

According to an embodiment, the first inverter forms part of the at least two inverters.

According to an embodiment, the comparator further comprises first and second transistors in series between the first node and a second node of application of a second DC potential, the comparator being configured to receive a power supply voltage between the first and second nodes and the first and second transistors being connected to each other at the level of the internal node.

According to an embodiment, the first potential is a reference potential, the first and second switches being implemented by NMOS transistors.

According to an embodiment, the first potential is a power supply potential, the first and second switches being implemented by PMOS transistors.

According to an embodiment, the potential of the internal node is representative of the comparison between two voltages to be compared applied to two respective inputs of the comparator.

Another embodiment provides a voltage converter comprising a comparator such as described.

According to an embodiment, the comparator is configured to compare an output voltage of the converter with a set point voltage of the converter.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
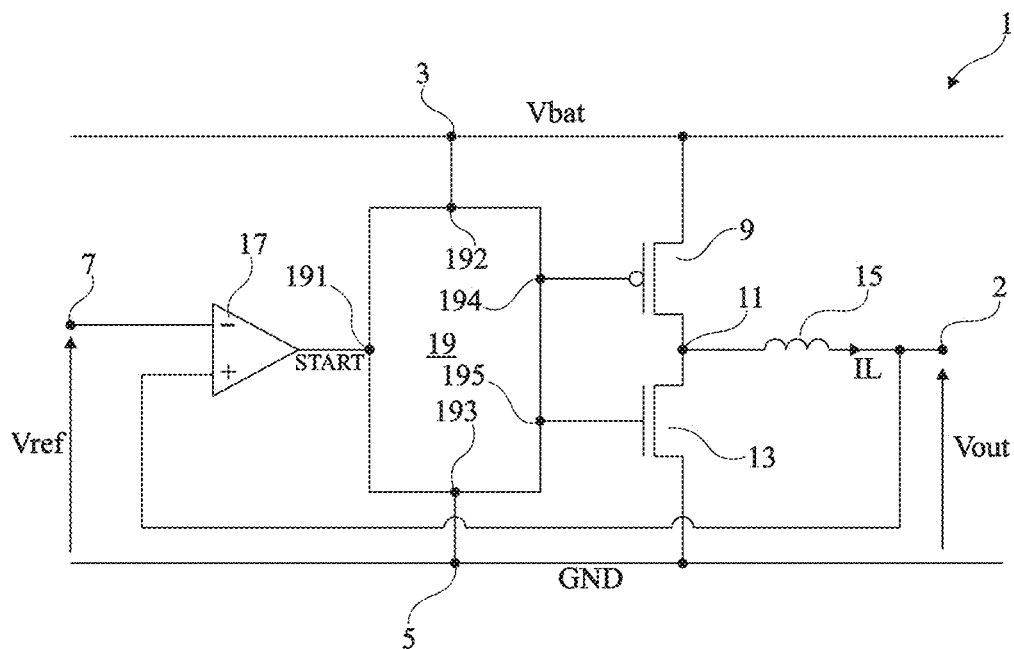
FIG. 1 very schematically shows an example of a voltage converter of the type to which the described embodiments apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the various usual electronic circuits, particularly integrated, where a voltage comparator may be provided, have not been detailed, the described embodiments being compatible with such usual circuits.

Throughout the present disclosure, unless otherwise specified, the term "connected" is used to designate a direct electrical connection between circuit elements, whereas the term "coupled" is used to designate an electrical connection between circuit elements that may be direct, or may be via one or more other elements.

In the following description, when reference is made to terms qualifying absolute positions, such as terms "front," "back," "top," "bottom," "left," "right," etc., or relative positions, such as terms "above," "under," "upper," "lower," etc., or to terms qualifying directions, such as terms "horizontal," "vertical," etc., unless otherwise specified, it is referred to the orientation of the drawings.

Unless otherwise specified, the terms "about," "approximately," "substantially," and "in the order of," are used herein to designate a tolerance of plus or minus 10%, preferably of plus or minus 5%, of the value in question.

In the following description, when reference is made to the voltage of a node or of a terminal, it is considered that it is, unless otherwise indicated, the voltage between the point or node and a reference potential, typically the ground. Further, when reference is made to the potential of a node or of a terminal, it is considered that this potential is, unless otherwise indicated, referenced to the reference potential. The voltage and the potential of a given node or of a given terminal will further be designated with a same reference.

In the following description, a signal which alternates between a first constant state, for example, a low state, noted "0," and a second constant state, for example, a high state, noted "1," is called a "binary signal." The high and low states of different binary signals of a same electronic circuit may be different. In particular, the high and low states of binary signals may correspond to voltages or to currents which may not be perfectly constant in the high or low state.

FIG. 1 very schematically shows an example of a voltage converter 1 of the type to which the described embodiments apply. In this example, converter 1 is a DC/DC converter, which converts a DC power supply voltage into a DC output voltage. In this example, converter 1 is of buck type, that is, the DC output voltage delivered by converter 1 has a lower value than its DC power supply voltage.

Converter 1 is configured to deliver a DC output voltage VOUT on an output node 2.

Converter 1 is powered with a DC power supply voltage Vbat. Converter 1 is connected between a conductive rail or node 3 configured to receive voltage Vbat or, in other words, DC potential Vbat, and a conductive rail or node 5 configured to receive a reference potential, typically ground GND.

Converter 1 is configured to deliver voltage Vout equal to a set point value. For this purpose, converter 1 receives, on an input node 7, a DC set point voltage Vref, having its value, in the present example, equal to the set point value of voltage Vout.

In this example, voltages Vout, Vbat, and Vref are positive.

Converter 1 comprises a first MOS transistor 9, preferably a PMOS transistor. MOS transistor 9 is connected between node 3 and a node 11. In other words, a first conduction terminal of transistor 9, for example, its source, is connected to rail 3, a second conduction terminal of transistor 9, for example, its drain, being connected to node 11.

Converter 1 further comprises a second MOS transistor 13, preferably an NMOS transistor. Transistor 13 is connected between node 11 and rail 5. In other words, a first conduction terminal of transistor 13, for example, its source, is connected to rail 5, a second conduction terminal of transistor 9, for example, its drain, being connected to node 11.

Thus, transistors 9 and 13 are series-connected between rails 3 and 5 and are connected to each other at the level of internal node 11.

Converter 1 comprises an inductive element or inductance 15. Inductance 15 is connected between node 11 and node 2.

Converter 1 comprises a voltage comparator 17. Voltage comparator 17 is configured to deliver a binary signal START representative of the comparison of voltage Vout with voltage Vref. In other words, comparator 17 is configured to deliver signal START in a first binary state if voltage Vout is greater than voltage Vref, and in a second binary state if voltage Vout is lower than voltage Vref. For this purpose, comparator 17 comprises a first input configured to receive voltage Vref, the first input here being connected to node 7, and a second input configured to receive voltage Vout, the second input here being connected to node 2. An output of comparator 17 delivers signal START.

The case where the first binary state of signal START corresponds to a high state of signal START and the second binary state of signal START corresponds to a low state of signal START is considered herein as an example. Voltage Vref is then received by the inverting input (−) of comparator 17 and voltage Vout is received by the non-inverting input (+) of comparator 17.

Although this is not shown in FIG. 1, comparator 17 is here powered with power supply voltage Vbat. Thus, comparator 17 comprises a node (or a terminal) connected to node 3 and a node (or a terminal) connected to node 5 to receive voltage Vbat. In the high state, voltage or signal START has a value substantially equal to that of voltage Vbat and, in the low state, voltage or signal START has a substantially zero value (ground).

Converter 1 comprises a control circuit 19. Circuit 19 is configured to implement or control the operating cycles of converter 1 to regulate voltage Vout to its set point value Vref (or based on voltage Vref).

For this purpose, circuit 19 comprises:

a terminal 191 coupled, preferably connected, to the output comparator 17, terminal 191 being configured to receive signal START;

terminals 192 and 193 coupled, preferably connected, to respective nodes 3 and 5 to receive power supply voltage Vbat;

a terminal 194 coupled, preferably connected, to a control terminal, or gate, of transistor 9; and a terminal 195 coupled, preferably connected, to a control terminal or gate of transistor 13.

Converter 1 comprises an output capacitor (not shown) connected between nodes 2 and 5. As an example, the capacitance is in the order of from 2.2 µF to 20 µF, or even more. Such an output capacitor plays the role of a filter. In other words, the converter output capacitor enables to smooth the current present on node 2 and to store power supplied to node 2 by the converter.

Although this is not shown herein, in operation, a load is connected between nodes 2 and 5 to be powered with potential Vout.

In the present example, converter 1 is configured to operate in pulse frequency modulation. Circuit 19 is then configured to start an operating cycle of converter 1 when voltage Vout is lower than voltage Vref and both transistors 9 and 13 are in the off state. More particularly, at the beginning of each operating cycle, while the two transistors 9 and 13 are in the off state and no current IL flows through inductance 15, circuit 19 is configured to control the setting to the on state of transistor 9, transistor 11 being left in the off state. Power is then stored in inductance 15 during a first time period when transistor 9 is maintained in the on state by circuit 19. At the end of this first time period, circuit 19 is configured to control the setting to the off state of transistor 9 and the setting to the on state of transistor 13. Power is then delivered back by inductance 15 to the load connected at the converter output, during a second time period when transistor 13 is maintained in the on state by circuit 19. At the end of this second time period, circuit 19 is configured to control the setting to the off state of transistor 13.

Signal START being representative of the fact that voltage Vout is or not lower than voltage Vref, output signal START of comparator 17 conditions the starting of an operating cycle of converter 1.

Figure 2:
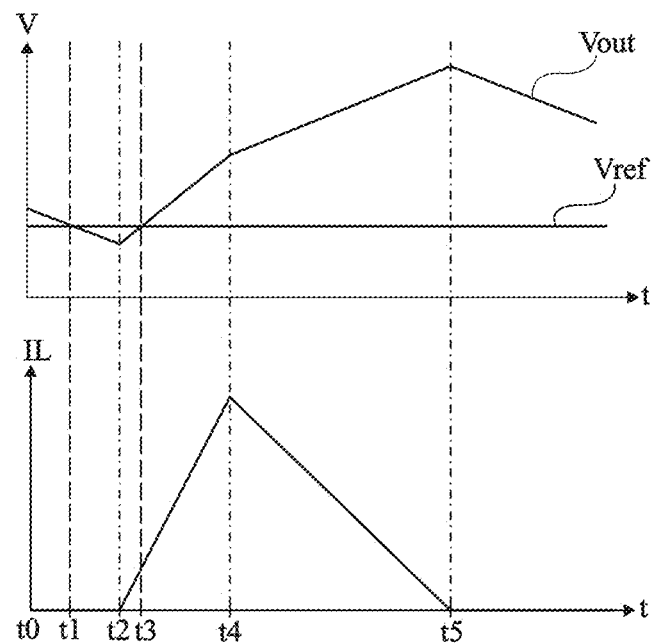
FIG. 2 shows timing diagrams illustrating a desired operation of the converter of FIG. 1, according to an embodiment.

FIG. 2 shows timing diagrams illustrating the desired operation of the converter 1 of FIG. 1.

The timing diagram at the top of FIG. 2 illustrates the variation over time t of voltage Vout, in volts V. The timing diagram at the bottom of FIG. 2 illustrates the corresponding variation, over time t, of the current IL flowing through inductance 15.

At a time t0, transistors 9 and 13 are in the off state, current IL is zero, and voltage Vout is greater than voltage Vref. Although this is not illustrated herein, signal START then is in the first binary state, the high state in the present example.

Between time t0 and a subsequent time t2, voltage Vout decreases, for example, due to the fact that the load connected to converter 1 consumes current.

At a time t1 between times t0 and t2, voltage Vout becomes smaller than voltage Vref. Although this is not shown in FIG. 2, as a result, between times t1 and t2, output START of comparator 17 switches form the first binary state to the second binary state, that is, the low state in the present example. As a response to such a switching of signal START, circuit 19 controls the setting to the on state of transistor 9, transistor 9 turning on at time t2.

From time t2, inductance 15 has a terminal connected to node 2 and a terminal coupled to rail 3, via transistor 9, and the current IL flowing through inductance 15 increases until a time t4 subsequent to time t2. Thus, between times t2 and t4, voltage Vout increases. In particular, voltage Vout becomes greater again than voltage Vref at a time t3 in the range from times t2 and t4 and, although this is not shown in FIG. 2, this results in output START of comparator 17 switching from the second binary state to the first binary state.

At time t4, circuit 19 controls the setting to the on state of transistor 13 and the setting to the off state of transistor 9.

From time t4 and until a time t5 subsequent to time t4, inductance 15 has a terminal connected to node 2 and a terminal coupled to rail 5, via transistor 13. Current IL flowing through inductance 15 decreases. As long as current IL is not zero, voltage Vout keeps on increasing if the current drawn by the load is lower than the current IL delivered to node 2.

At time t5, the current IL in inductance 15 becomes zero and circuit 19 controls the setting to the off state of transistor 13. From this time, voltage Vout decreases, similarly to what happened at time t0.

Although this is not shown herein, if voltage Vout falls back below voltage Vref at a time subsequent to time t5, output START switches back to its second binary state and, as a response to this switching, circuit 19 implements a new operating cycle such as described in relation with times t2, t4, and t5.

Figure 3:
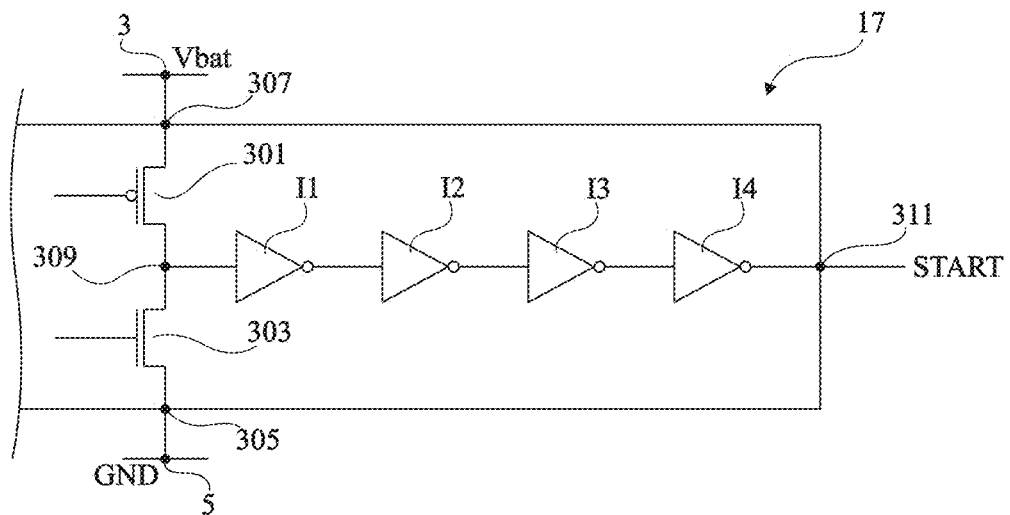
FIG. 3 partially and schematically shows an embodiment of a voltage comparator.

FIG. 3 partially and schematically shows an embodiment of voltage comparator 17.

Comparator 17 comprises a PMOS transistor 301 and an NMOS transistor 303 series-connected between a node 305 configured to receive a reference potential and a node 307 configured to receive a power supply potential. In other words, comparator 17 is configured to receive a power supply voltage between nodes 305 and 307. In this example, comparator 17 is powered with voltage Vbat, node 305 being coupled, preferably connected, to node 5 and node 307 being coupled, preferably connected, to node 3.

Transistors 301 and 303 are connected to each other at the level of an intermediate node 309 of comparator 17. More particularly, the source of transistor 301 is coupled, preferably connected, to node 307, the source of transistor 303 is coupled, preferably connected, to node 305 and the drains of transistors 301 and 303 are both coupled, preferably connected, to node 309.

Transistors 301 and 303 form an output stage of comparator 17.

Comparator 17 is configured so that the potential of node 309 is representative of the comparison between the two voltages compared by comparator 17, that is, voltages Vref and Vout in the present example. More precisely, comparator 17 is configured to control transistors 301 and 303 based on the difference between the voltages to be compared that it receives, whereby the potential of node 309 is representative of the comparison of the voltages to be compared received by comparator 17.

For example, when the voltage received by the first input of comparator 17, for example, the voltage Vref received by the inverting input, is greater than that received by the second input of comparator 17, for example, the voltage Vout received by the non-inverting input, transistors 301 and 303 are controlled so that the current delivered to node 309 via transistor 301 is lower than the current drawn from node 309 by transistor 303, whereby the potential of node 309 is drawn towards the potential of node 305. Conversely, when the voltage received by the first input is lower than that received by the second input, transistors 301 and 303 are controlled so that the current supplied to node 309 via transistor 301 is greater than the current drawn from node 309 by transistor 303, whereby the potential of node 309 is pulled towards the potential of node 307.

Comparator 17 further comprises a gain stage, coupling the internal node 309 of output stage 301, 303 of the comparator to an output, or output node or terminal 311 of comparator 17. The gain stage comprises a plurality of inverters in series between node 309 and output 311. In this example, the comparator output is configured to deliver signal START.

In the shown example, the comparator comprises, from node 309 to node 311, four inverters, respectively I1, I2, I3, and I4. The input of inverter I1 is connected to node 309, its output being connected to the input of inverter I2. The input of inverter I3 is connected to the output of inverter I2, the output of inverter I3 being connected to the input of inverter I4. The output of inverter I4 is connected to output 311 of the comparator.

Thus, according to the potential of node 309, the output of inverter I1 is in the high state or in the low state, whereby signal START is respectively in the low state or in the high state.

Taking the above example, when the potential of node 309 is pulled towards the potential of node 305 and becomes smaller than a switching threshold of inverter I1, the output thereof switches to the high state, which causes the switching to the low state of signal START. Conversely, when the potential of node 309 is pulled towards the potential of node 307 and becomes greater than a switching threshold of inverter I1, the output thereof switches to the low state, which causes the switching to the high state of signal START.

However, in practice comparator 17 may cause a malfunction of converter 1. Indeed, referring again to the timing diagrams of FIG. 2, when voltage Vout becomes equal to and then smaller than voltage Vref at time t1, the potential of node 309, then greater than the switching threshold of inverter I1, decreases to become lower than the switching threshold of inverter I1. This causes the switching to the high state of the output of inverter I1 and, after the propagation of this switching through inverters I2, I3, and I4, the switching to the low state of output signal START of comparator 17. During such switchings of the inverters of the gain stage of comparator 17, current is drawn from nodes 305 and 307, and thus respectively from nodes 5 and 3. This particularly results in unwanted variations of the potential GND present on node 3, linked to the parasitic resistance on potential GND or, in other words, linked to the parasitic resistance of rail 5 at potential GND. Such unwanted variations of potential GND result in unwanted variations of voltage Vout. Such unwanted variations of voltage Vout may result in voltage Vout becoming greater again than voltage Vref at the time of the switching of the output of inverter I1 to the high state. When, due to such unwanted variations of voltage Vout, the latter becomes greater again than voltage Vref, the potential of node 309 is then pulled towards the potential of node 307 and may become greater again than the switching threshold of inverter I1. If this occurs, the output of inverter I1 switches to the low state, which results in output START switching to the high state, which is not desirable. More generally, output START of comparator 17 may start oscillating, which is not desirable. Indeed, the first switching(s) to the low state of signal START may for example be too short to be detected by circuit 19, which thus triggers no operating cycle. This results in a delay in the implementation of a phase of power storage in inductance 15, and thus in a poor regulation of voltage Vout.

To prevent such oscillations of signal START, it could have been devised to replace comparator 17 with a static hysteresis comparator. However, when using a static hysteresis comparator, when voltage Vout decreases and crosses voltage Vref and signal START switches to the low state, for signal START to switch to the high state, voltage Vout should become greater than voltage Vref plus, or increased by, a fixed or constant hysteresis value. This raises an issue. For example, if, at the end of an operating cycle of converter 1, voltage Vout has increased from a value smaller than Vref to a value between Vref and Vref plus the hysteresis value, signal START will not switch to the high state even though voltage Vout is greater than voltage Vref. Thus, from as soon as the end of the operating cycle of converter 1, circuit 19 erroneously deduces from the low state of signal START that voltage Vout is still lower than voltage Vref, and starts a new operating cycle, which is however not necessary.

Figure 4:
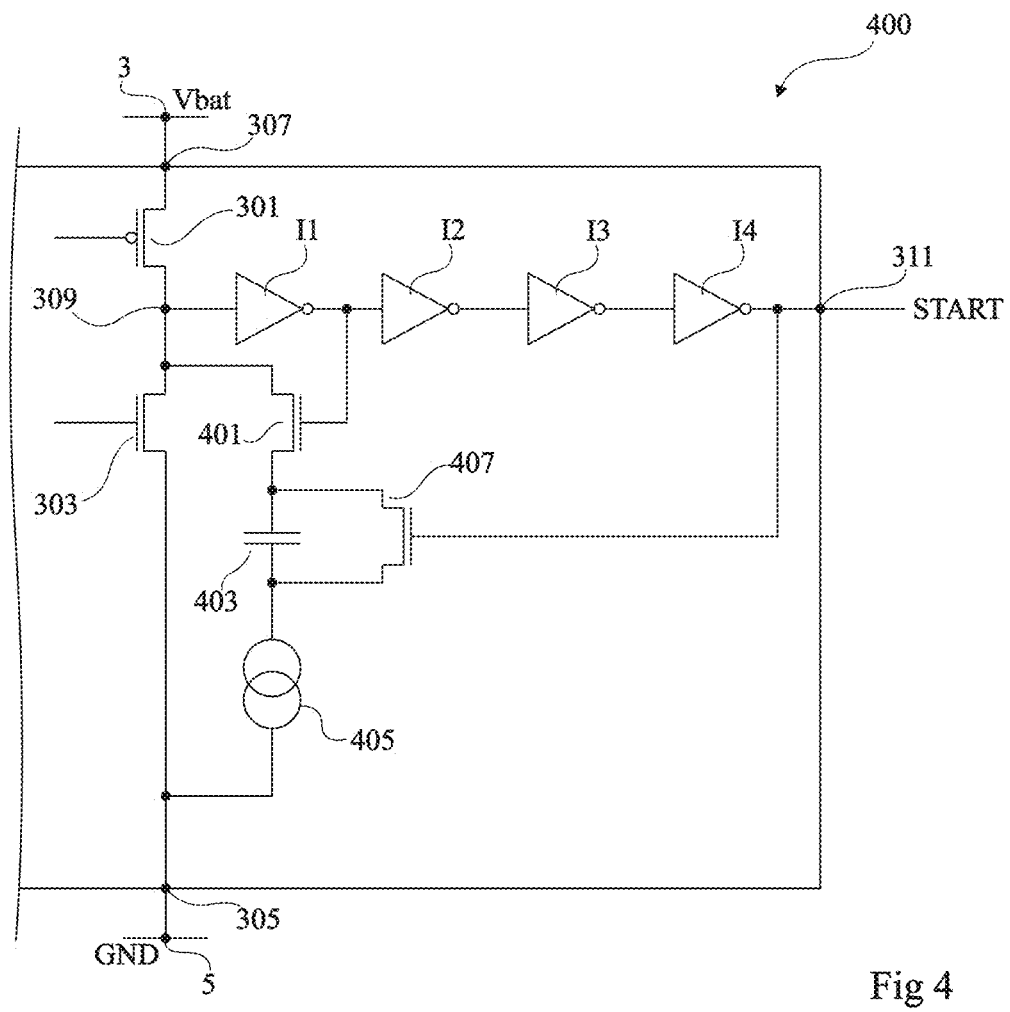
FIG. 4 partially and schematically shows an embodiment of a voltage comparator.

FIG. 4 partially and schematically shows an embodiment of a voltage comparator 400. Comparator 400 comprises many elements in common with comparator 17 which will not be detailed again, only the differences between comparators 17 and 400 being here highlighted. The case where comparator 400 is used as a comparator 17 of the converter 1 described in relation with FIG. 1 or, in other words, comparator 400 replaces comparator 17 in converter 1, is here considered as an example.

As compared with comparator 17, comparator 400 comprises a (first) switch 401 having a conduction terminal connected to internal node 309. Comparator 400 further comprises a capacitor, or capacitive element, 403, and a current source 405. Switch 401, capacitor 403, and current source 405 are series-connected, in this order, between node 309 and node 305. In other words, another conduction terminal of switch 401 is coupled, preferably connected, to a terminal or electrode of capacitor 403, the other terminal or electrode of capacitor 403 being coupled, preferably connected, to a terminal of current source 405, and the other terminal of current source 405 being coupled, preferably connected, to node 305.

Comparator 400 also comprises a (second) switch 407 connected in parallel with capacitor 403. In other words, a conduction terminal of switch 407 is connected to a terminal of capacitor 403, the other conduction terminal of switch 407 being connected to the other terminal of capacitor 403.

In this embodiment where current source 405 is coupled, preferably connected, to node 305 at potential GND, switch 401 is configured to turn on when a potential variation of node 309 causes a switching of signal START to the low state. Further, as a response to the switching of signal START to the low state, switch 407 is configured to turn off after the turning on of switch 401. The turning on of switch 407 results, like the turning off of switch 401, from a variation of the potential of node 309 causing a switching of signal START to the low state, that is, here, from a variation of the potential of node 309 to the potential of node 305 during which the potential of node 309 becomes lower than the switching threshold of inverter I1. Further, current source 405 is here configured to draw current from node 309 when switch 401 is on and switch 407 is off.

According to an embodiment, switches 401 and 407 are controlled by the outputs of two inverters of the gain stage of comparator 400. Thus, the control of switches 401 and 407 does not require providing an additional control circuit with respect to the comparator 17 described in relation with FIG. 3.

According to an embodiment, switches 401 and 407 are each implemented by a MOS transistor, for example, NMOS transistors.

According to an embodiment, transistor 401 is controlled by the output of inverter I1, that is, by an inverter having its input coupled, preferably connected, to node 309. In other words, a control terminal or gate of transistor 401 is coupled, preferably connected, to the output of inverter I1.

As a variation, transistor 401 is controlled by the output of inverter I3. However, an advantage of controlling transistor 401 with the output of inverter I1 rather than with the output of inverter I3 is that the turning on of switch 401 occurs sooner after the potential of node 309 has become lower than the switching threshold of inverter I1.

According to an embodiment, transistor 407 is controlled by the output of inverter I4, that is, by an inverter having its output coupled, preferably connected, to output 311 of comparator 400. In other words, a control terminal or gate of transistor 407 is coupled, preferably connected, to the output of inverter I4.

As a variation, when transistor 401 is controlled by the output of inverter I1, transistor 407 may be controlled by the output of inverter I2. However, an advantage of controlling transistor 407 with the output of inverter I4 rather than with the output of inverter I2 is that the turning off of switch 407 only occurs after the switching of signal START.

In comparator 400, the turning on of switch 401, while switch 407 is on, enables to pull the potential of node 309 to the potential of node 305 having current source 405 coupled thereto. In other words, the turning on of switch 401 enables to confirm the state of node 309 with respect to the switching threshold of inverter I1 (and thus of output 311). In this embodiment, the turning on of switch 401 enables to confirm that the potential of node 309 is lower than the switching threshold of inverter I1 or, in other words, to confirm a low state of node 309. Further, current source 405 draws current from node 309 in addition to the current already drawn from node 309 by transistor 303. This amounts, in practice, to increasing voltage Vref by a hysteresis value defined by the current drawn from source 405, so that voltage Vout should then be greater than voltage Vref plus the hysteresis value in order for the comparator output to be able to switch to the high state.

Further, the turning off of switch 407, while switch 401 is on, causes the beginning of a timing at the end of which the potential of node 309 recovers the value that it would have had in the absence of switches 401 and 407, of capacitor 403, and of current source 405 or, in other words, at the end of which voltage Vref is no longer increased by the hysteresis value. The duration of such a timing is at least partly determined by the load of capacitor 403 or, in other words, by the value of the current delivered by current source 405 and by the value of capacitor 403.

An advantage of increasing voltage Vref by a hysteresis value only between the time when the potential of node 309 becomes lower than the switching threshold of inverter I1 and the end of the previously-described timing is that, in practice, voltage Vout keeps on decreasing. As a result, at the end of the timing, when the potential of node 309 recovers the value that it would have had in the absence of elements 401, 403, 405, and 407, this value is lower than at the time of the switching of the output of inverter I1 to the high state. Further, as long as voltage Vref is increased by the hysteresis value, even if voltage Vout varies in unwanted fashion, resulting in voltage Vout becoming greater than voltage Vref before decreasing back below voltage Vref, as long as voltage Vout does not become greater than voltage Vref plus the hysteresis value, signal START remains in the low state. As compared with a static hysteresis comparator where voltage Vref would permanently be increased by a hysteresis value, comparator 400 is a dynamic hysteresis comparator when voltage Vref is increased by a hysteresis value only for a certain time period after the switching to the low state of signal START.

For a given application, it will be within the abilities of those skilled in the art to determine the value of the current of current source 405 to avoid for an unwanted variation of voltage Vout while the hysteresis is applied to voltage Vref to cause a switching to the low state of the output of inverter I1. It will also be within the abilities of those skilled in the art to determine the value of the current of current source 405 and the capacitance value, and thus the duration of the timing, particularly so that, when the potential of node 309 recovers the value that it would have had in the absence of elements 401, 403, 405, and 407, the value of potential 309 is sufficiently distant from the switching threshold of inverter I1 to avoid for an unwanted variation of voltage Vout to cause a switching to the low state of the output of inverter I1. In other words, it will be within the abilities of those skilled in the art to determine the value of the current of current source 405 and the capacitance value so that, at the end of the timing, the value of the potential of node 309 is no longer in a critical zone, or critical range of values, where an unwanted variation of voltage Vout might result in an unwanted switching of the output of inverter I1 to the high state.

Figure 5:
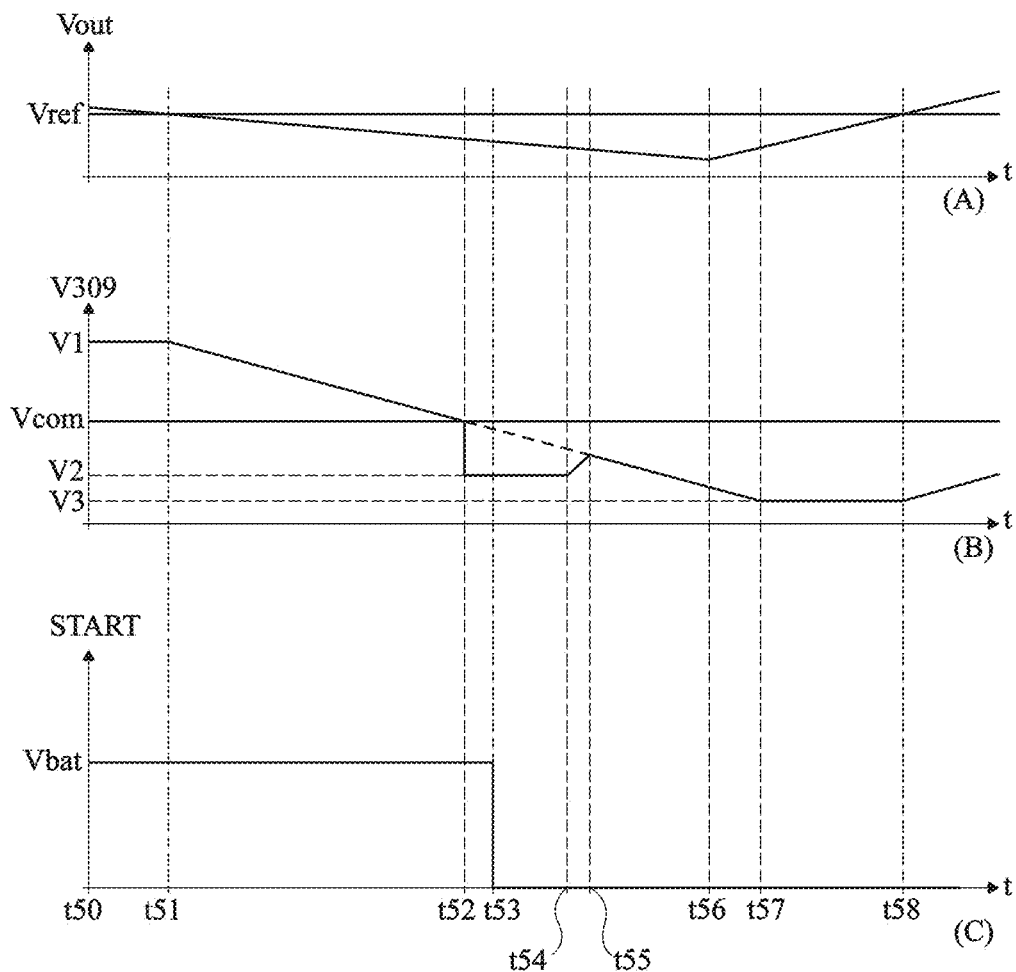
FIG. 5 shows timing diagrams illustrating the operation of the comparator of FIG. 4, according to an embodiment.

FIG. 5 shows very simplified timing diagrams illustrating the operation of the comparator 400 of FIG. 4, in the case where comparator 400 replaces the comparator 17 of converter 1 (FIG. 1). More particularly, FIG. 5 shows a timing diagram A (at the top of FIG. 5) illustrating the variation over time t of voltage Vout, a timing diagram B (in the middle of FIG. 5) illustrating the variation over time t of potential V309 of node 309, and a timing diagram C (at the bottom of FIG. 5) illustrating the variation over time t of the output signal START of comparator 400.

At a time t50, voltage Vout is greater than voltage Vref, the potential V309 of node 309 is greater than the switching threshold Vcom of inverter I1, and signal START is in the high state. In the present example, voltage Vout has been greater than voltage Vref for a sufficiently long time for the potential of node 309 to be at a high or maximum value V1, for example, substantially equal to the potential of node 307.

Further, at time t50, switches 401 and 407 are respectively off and on.

At time t50 and after time t50, voltage Vout decreases, for example due to the current drawn from output node 2 of converter 1 by a load.

At a next time t51, voltage Vout becomes equal to and then smaller than voltage Vref. As a result, the current drawn from node 309 by transistor 303 becomes greater than the current supplied to node 309 by transistor 301, and potential V309 decreases.

At a next time t52, potential V309 becomes equal to and then smaller than threshold Vcom. The output (not illustrated in FIG. 5) of inverter I1 then switches to the high state. This results in the turning on of switch 401. In practice, switch 401 turns on after time t52 although FIG. 5 shows this turning on at time t52. The turning on of switch 401 results in potential V309 being pulled towards the potential of node 305 or, in other words, potential V309 is placed at a value V2 lower than threshold Vcom. Still in other words, the potential V309 of node 309 decreases down to value V2, which is lower than the value that it would have had in the absence of elements 401, 403, 405 and 407. Value V2 is preferably outside of the critical range of values of potential V309. In FIG. 5, between time t52 and a subsequent time t55, the value that potential V309 would have had in the absence of elements 401, 403, 405, and 407 and of unwanted variations of voltage Vout is shown in dotted lines.

At a next time t53, the switching of the output of inverter I1 has propagated through inverter chain I2, I3, and I4 all the way to output 311 of the comparator, whereby signal START switches to the low state.

Between times t52 and t53, during successive switchings of inverters I1 to I4, if the value of voltage Vout varies according to variations of potential GND on node 5, and particularly if voltage Vout becomes greater than voltage Vref, as long as the current drawn from node 309 by source 405 and transistor 303 remains greater than the current delivered to node 309 by transistor 301, potential V309 remains substantially equal, or even equal to value V2, and thus does not become greater again than threshold Vcom, conversely to what might occur in the comparator 17 described in relation with FIG. 4. In other words, even if voltage Vout becomes greater than voltage Vref due to unwanted variations of voltage Vout, as long as voltage Vout remains smaller than voltage Vref increased by the dynamic hysteresis value, the output of comparator 400 remains in the low state. It will be within the abilities of those skilled in the art to size, for a given application, current source 405, and thus value V2, to prevent for an unwanted variation of voltage Vout up to values greater than voltage Vref to cause an increase of potential V309 up to a value greater than that of threshold Vcom or, in other words, to select a dynamic hysteresis value.

At time t53, the switching of the output of inverter I4 to the low state causes the turning off of switch 407. Thus, from time t53, capacitor 403 is charged by the current of current source 405.

Until a next time t54, the voltage across capacitor 403 is such that source 405 remains capable of delivering a constant current and potential V309 is maintained at a value substantially equal, or even equal, to value V2, as soon as the current delivered to node 309 by transistor 301 remains lower than the current drawn from node 309 by transistor 303 and current source 405.

At time t54, the voltage across capacitor 403 reaches a value such that source 405 is no longer capable of delivering a constant current, source 405 for example delivering a lower and lower current from time t54. As a result, from time t54, potential V309 tends to recover the value that it would have had in the absence of elements 401, 403, 405, and 407.

At a next time t55, potential V309 recovers the value that it would have had in the absence of elements 401, 403, 405, and 407 and then varies as if elements 401, 403, 405, and 407 were absent. In particular, in this example where voltage Vout remains lower than voltage Vref between time t51 and a time t58 subsequent to time t55 and where, at time t55, potential V309 has not reached a low or minimum value V3, potential V309 decreases from time t55 to reach value V3 at a time t57 between times t55 and t58.

In the example of FIG. 5, at a time t56 between times t55 and t57, the circuit 19 of converter 1 starts an operating cycle as a response to the low state of signal START. Thus, from time t56, voltage Vout increases. As long as voltage Vout remains lower than voltage Vref, potential V309 remains pulled towards value V3, or even is equal to value V3.

In the example of FIG. 5, at time t58, voltage Vout becomes equal to and then greater than voltage Vref. As a result, from time t58, the current delivered to node 309 by transistor 301 becomes equal to and then greater than the current drawn from node 309 by transistor 303, and thus the potential of node 309 increases and is progressively pulled towards the potential of node 307.

Although this is not shown in the example of FIG. 5, at a time subsequent to time t58, the potential of node V309 becomes equal to and then greater than threshold Vcom, which results, in the following order, in the switching of the output of inverter I1 to the low state, the turning off of switch 401, the switching of signal START to the high state, and the turning on of switch 407.

An example where voltage Vout remains lower than voltage Vref between times t51 and t56 has been described herein. However, as already indicated, even if unwanted variations of voltage Vout result in voltage Vout becoming greater than voltage Vref at times between time t52 and time t54, due to potential V309 being pulled towards value V2 between times t52 and t54, such variations do not cause a switching of signal START to the high state, provided for value V2 to be selected sufficiently low with respect to the maximum values that voltage Vout can take between times t52 and t54, the selection of value V2 being within the abilities of those skilled in the art.

Further, in other examples, not shown, the circuit 19 of converter 1 starts an operating cycle before time t54, whereby voltage Vout becomes greater again than voltage Vref before time t54. In this case, from time t54, the potential of node 309 tends to recover the value that it would have had in the absence of elements 401, 403, 405, and 407, that it reaches at time t55, even if this value is then greater than threshold Vcom. In this last case, between times t54 and t55, potential V309 crosses threshold Vcom, whereby signal START switches to the high state. Thus, conversely to the already previously mentioned case of a static hysteresis comparator, signal START of comparator 400 switches sooner to the high state.

An embodiment of comparator 400 where switches 401 and 407, capacitor 403, and current source 405 first enable to confirm, when potential V309 becomes smaller than the switching threshold of inverter I1, the low state of potential V309, and then to maintain the low state of signal START for a determined time period, has been described here-above in relation with FIGS. 4 and 5. In this embodiment, current source 405 is then coupled, preferably connected, to node 305, to draw current from node 309.

In an alternative embodiment of comparator 400, switches 401 and 407, capacitor 403, and current source 405 first enable to confirm, when the potential of node 309 becomes greater than the switching potential of inverter I1, a high state of potential V309 and then to hold the high state of signal START for a time period determined by the value of the current delivered by current source 405 and by the value of capacitor 403. The potential of node 309 here is said to be in the high state when it is greater than the switching threshold of inverter I1. In this variation, the terminal of current source 405 opposite to capacitor 403 is then coupled, preferably connected, to node 307, to deliver current to node 309. Further, in this variation, switches 401 and 407 are preferably each implemented by a PMOS transistor. In this variation, switch 401 is configured to turn on when the potential of node 309 becomes greater than threshold Vcom, for example, when the output of inverter I1 switches to the low state, and switch 407 is configured to turn off after the turning on of switch 401, for example, when signal START switches to the high state. In other words, the turning on of switches 401 and 407 results from a variation of the potential of node 309 causing a switching of signal START from its low state to its high state, that is, here, from a variation of the potential of node 309 to the potential of node 307 during which the potential of node 309 crosses the switching threshold of inverter I1.

The embodiment of comparator 400 described in relation with FIGS. 4 and 5 and the above alternative embodiment may be combined. Comparator 400 then comprises:

switch 401, capacitor 403, and current source 405 series-connected between nodes 309 and 305;

switch 407 in parallel with capacitor 403;

an additional switch, an additional capacitor, and an additional current source series-connected between nodes 309 and 307; and another additional switch in parallel with the additional capacitor. The detailed implementation of this combination is within the abilities of those skilled in the art based on the functional indications given here-above.

Embodiments and variations where the gain stage of comparator 400 comprises four inverters in series between nodes 309 and 311 have been described here-above. It will be within the abilities of those skilled in the art to modify the number of inverters in series between nodes 309 and 311, preferably by providing an even number and/or a number greater than or equal to two inverters in series.

Further, although embodiments and variations where switch 401 is controlled by the output of an inverter of the gain stage of comparator 400 have been described here-above, it may be provided for the switch to be controlled by the output of an additional inverter which does not belong to the gain stage and comprising an input coupled, respectively connected, to node 309.

Although converter 1 has been described in the case where circuit 19 orders the beginning of an operating cycle if signal START is in the low state, it will be within the abilities of those skilled in the art to adapt converter 1 to the case where circuit 19 orders the beginning of an operating cycle if signal START is in the high state, particularly by inverting the inputs of the comparator having the respective voltage Vref and Vout provided thereto.

Further, although the operation and the advantages of comparator 400 have been illustrated in the case where it replaces the comparator 17 of converter 1, comparator 400 may be provided in others types of converters, and more generally in other electronic circuits, and may have the same advantages therein. For example, comparator 400 may be provided in many systems where a first voltage representative of the value of an output quantity of the system is compared with a voltage representative of a set point value of the output quantity of the system.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given here-above. In particular, the implementation of the non-illustrated portion of comparator 400 will be within the abilities of those skilled in the art based on the functional indications given here-above, and different implementations can be envisaged. For example, this non-illustrated portion may correspond to a differential pair, each of transistors 301 and 303 enabling to copy a current flowing through one of the branches of the differential pair, or, in other words, the current flowing through one of transistors 301 and 303 is an image of the current flowing through one of the branches of the differential pair, the current flowing in the other one of transistors 301 and 303 being an image of the current flowing through the other one of the branches of the differential pair.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A voltage comparator comprising:
    an output terminal;
    a first switch having a conduction terminal coupled to an internal node, the internal node coupled to the output terminal;
    a current source;
    a capacitor; and
    a second switch coupled in parallel with the capacitor, wherein the current source, the capacitor, and the first switch are series-connected, wherein the current source comprises a first terminal coupled to the capacitor, and a second terminal coupled to a first node, the first node configured to receive a first voltage, and wherein the first switch is configured to turn on and the second switch is configured to turn off after the turning on of the first switch when a variation of an internal voltage of the internal node towards the first voltage causes a switching of an output voltage of the output terminal.

2. The comparator of claim 1, further comprising a first inverter having an input coupled, to the internal node and an output configured to control the first switch.

3. The comparator of claim 2, wherein the first inverter is configured to control a turning on of the first switch after the variation of the internal voltage towards the first voltage.

4. The comparator of claim 2, further comprising a second inverter having an input coupled to the internal node and an output coupled to the output terminal, wherein the output of the second inverter is configured to control the second switch.

5. The comparator of claim 4, wherein the second inverter is configured to control a turning off of the second switch after the variation of the internal voltage towards the first voltage.

6. The comparator of claim 2, comprising a plurality of inverters coupled in series between the output of the first inverter and the output terminal.

7. The comparator of claim 1, wherein the comparator is configured to receive a first input voltage and a second input voltage, and wherein an internal voltage of the internal node is representative of a comparison between the first and second input voltages.

8. A voltage comparator comprising:
    an output terminal;
    a first switch having a conduction terminal coupled to an internal node, the internal node coupled to the output terminal;
    a current source;
    a capacitor; and
    a second switch coupled in parallel with the capacitor, wherein the current source, the capacitor, and the first switch are series-connected, wherein the current source comprises a first terminal coupled to the capacitor, and a second terminal coupled to a first node, the first node configured to receive a first voltage, and wherein the first node is connected to ground.

9. A voltage comparator comprising:
    an output terminal;
    a first switch having a conduction terminal coupled to an internal node, the internal node coupled to the output terminal;
    a current source;
    a capacitor;
    a second switch coupled in parallel with the capacitor, wherein the current source, the capacitor, and the first switch are series-connected, wherein the current source comprises a first terminal coupled to the capacitor, and a second terminal coupled to a first node, the first node configured to receive a first voltage; and
    first and second transistors in series between the first node and a second node, the second node configured to receive a second voltage.

10. The comparator of claim 9, wherein the comparator is configured to receive a power supply voltage between the first and second nodes, and wherein the first and second transistors are coupled to each other at the internal node.

11. The comparator of claim 9, wherein the second voltage is higher than the first voltage.

12. A voltage comparator comprising:
an output terminal;
a first switch having a conduction terminal coupled to an internal node, the internal node coupled to the output terminal;
a current source;
a capacitor; and
a second switch coupled in parallel with the capacitor, wherein the current source, the capacitor, and the first switch are series-connected, wherein the current source comprises a first terminal coupled to the capacitor, and a second terminal coupled to a first node, the first node configured to receive a first voltage, and
wherein the first voltage is a ground voltage, and wherein the first and second switches are metal-oxide semiconductor (MOS) transistors of the N-type, or
wherein the first voltage is a power supply voltage, and wherein the first and second switches are metal-oxide semiconductor (MOS) transistors of the P-type.

13. The comparator of claim 12, wherein the first voltage is a power supply voltage, and wherein the first and second switches are metal-oxide semiconductor (MOS) transistors of the P-type.

14. A voltage converter comprising:
an output stage;
a comparator having a first input coupled to an output of the output stage, a second input configured to receive a reference voltage, and an output; and
a control circuit configured to control the output stage based on the output of the comparator, the comparator comprising:
a first switch having a conduction terminal coupled to an internal node, the internal node coupled to the output of the comparator and configured to have an internal voltage that is representative of a comparison between the reference voltage and an input voltage at the first input of the comparator,
a current source,
a capacitor, and
a second switch coupled in parallel with the capacitor, wherein the current source, the capacitor, and the first switch are series-connected.

15. The converter of claim 14, further comprising an inductor coupled to the output of the output stage, wherein the converter is configured to generate an output voltage at an output node coupled to the inductor, and wherein the first input of the comparator is configured to receive the output voltage.

16. A method of operating a voltage comparator, the method comprising:
receiving first and second input voltages;
generating an internal voltage at an internal node based on comparing the first and second input voltages;
when the internal voltage has a first voltage that is different from a threshold voltage,
turning off a first transistor having a first conduction terminal coupled to the internal node, and a control terminal coupled to an output of a first inverter, the first inverter having an input coupled to the internal node, and
turning on a second transistor having a first conduction terminal coupled to a second conduction terminal of the first transistor, and a control terminal coupled to the control terminal of the first transistor via a plurality of inverters;
when the internal voltage transitions from the first voltage to a second voltage, turning on the first transistor, wherein the threshold voltage is between the first and second voltages;
a first time after turning on the first transistor, turning off the second transistor; and
generating an output voltage at an output terminal of the voltage comparator, the output terminal coupled to the control terminal of the second transistor.

17. The method of claim 16, wherein the first time is based on a capacitance coupled between the first conduction terminal of the second transistor and a second conduction terminal of the second transistor, and a current flowing through a current generator that is coupled to the capacitance.

18. The method of claim 16, wherein the first voltage is higher than the second voltage.

19. The method of claim 16, wherein a capacitor is coupled across the first and a second conduction terminals of the second transistor, and wherein a current source comprises a first terminal coupled to the capacitor and the second transistor.

20. The method of claim 19, wherein the current source comprises a second terminal coupled to ground, and wherein a third transistor comprises a first conduction terminal coupled to the internal node, and a second conduction terminal coupled to ground.

\* \* \* \* \*